(12) United States Patent
Ting et al.

(10) Patent No.: US 7,927,954 B2
(45) Date of Patent: Apr. 19, 2011

(54) METHOD FOR FABRICATING STRAINED-SILICON METAL-OXIDE SEMICONDUCTOR TRANSISTORS

(75) Inventors: Shyh-Fann Ting, Tai-Nan (TW);
Cheng-Tung Huang, Kao-Hsiung (TW);
Li-Shian Jeng, Tai-Tung Hsien (TW);
Kun-Hsien Lee, Tai-Nan (TW);
Wen-Han Hung, Kao-Hsiung (TW);
Tzyy-Ming Cheng, Hsin-Chu (TW);
Meng-Yi Wu, Kaohsiung County (TW);
Tsai-Fu Hsiao, Hsin-Chu (TW);
Shu-Yen Chan, Changhua County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 491 days.

(21) Appl. No.: 11/678,627

(22) Filed: Feb. 26, 2007

(65) Prior Publication Data
US 2008/0206942 A1 Aug. 28, 2008

(51) Int. Cl.
*H01L 21/336* (2006.01)
(52) U.S. Cl. ........ 438/300; 438/231; 438/305; 438/529; 438/530; 438/595; 257/E21.12; 257/E21.131; 257/E21.431; 257/E21.433

(58) Field of Classification Search .............. 438/300, 438/231, 305, 529, 530, 595; 257/E21.431, 257/E21.12, E21.131, E21.433
See application file for complete search history.

(56) References Cited

U.S. PATENT DOCUMENTS

| 7,227,205 | B2 | 6/2007 | Bryant | |
|---|---|---|---|---|
| 2003/0211670 | A1* | 11/2003 | Downey | 438/197 |
| 2005/0082616 | A1* | 4/2005 | Chen et al. | 257/350 |
| 2006/0073665 | A1* | 4/2006 | Jain | 438/303 |
| 2007/0184600 | A1* | 8/2007 | Zhang et al. | 438/199 |

FOREIGN PATENT DOCUMENTS

| TW | 586182 | 5/2004 |
|---|---|---|
| TW | I305031 | 1/2009 |

* cited by examiner

*Primary Examiner* — Mary Wilczewski
*Assistant Examiner* — Toniae M Thomas
(74) *Attorney, Agent, or Firm* — Winston Hsu; Scott Margo

(57) ABSTRACT

A method for fabricating strained-silicon transistors is disclosed. First, a semiconductor substrate is provided and a gate structure and a spacer surrounding the gate structure are disposed on the semiconductor substrate. A source/drain region is then formed in the semiconductor substrate around the spacer, and a first rapid thermal annealing process is performed to activate the dopants within the source/drain region. An etching process is performed to form a recess around the gate structure and a selective epitaxial growth process is performed to form an epitaxial layer in the recess. A second rapid thermal annealing process is performed to redefine the distribution of the dopants within the source/drain region and repair the damaged bonds of the dopants.

27 Claims, 13 Drawing Sheets

METHOD FOR FABRICATING STRAINED-SILICON METAL-OXIDE SEMICONDUCTOR TRANSISTORS

BACKGROUND OF THE INVENTION

1. Field of the Invention

The invention relates to a method for fabricating strained-silicon transistors.

2. Description of the Prior Art

The performance of MOS transistors has increased year after year with the diminution of critical dimensions and the advance of large-scale integrated circuits (LSI). However, it has been recently pointed out that the miniaturization attained by a lithographic technology has reached its limit. Therefore, how to improve the carrier mobility so as to increase the speed performance of MOS transistors has become a major topic for study in the semiconductor field. For the known arts, attempts have been made to use a strained silicon layer, which has been grown epitaxially on a silicon substrate with a silicon germanium (SiGe) layer disposed therebetween. In this type of MOS transistor, a biaxial tensile strain occurs in the epitaxy silicon layer due to the silicon germanium which has a larger lattice constant than silicon, and, as a result, the band structure alters, and the carrier mobility increases. This enhances the speed performance of the MOS transistors.

Please refer to FIGS. 1-4. FIGS. 1-4 illustrate a method of utilizing selective epitaxial growth process for fabricating a strained-silicon transistor according to the prior art. As shown in FIG. 1, a semiconductor substrate 10, such as a silicon substrate is provided. The semiconductor substrate 10 includes a gate structure 12 thereon, in which the gate structure 12 includes a gate dielectric 14 and a gate 16 disposed on the gate dielectric 14. An ion implantation process is performed thereafter to inject a p-type or n-type dopant of smaller concentration into the semiconductor substrate 10. The implantation process preferably forms a lightly doped drain 24 in the semiconductor substrate 10 surrounding the gate structure 12. An offset spacer 18 is formed on the sidewall of the gate structure 12 and a spacer 20 is formed surrounding the offset spacer 18 thereafter. Preferably, the gate dielectric 14 is composed of silicon dioxide, the gate 16 is composed of doped polysilicon, and the offset spacer 18 and the spacer 20 are composed of oxides and nitride-oxides respectively. The active area of the semiconductor substrate 10 including the gate structure 12 is preferably encompassed by a shallow trench isolation 22.

As shown in FIG. 2, another ion implantation process is performed to inject a p-type or n-type dopant of higher concentration into the semiconductor substrate 10 surrounding the lightly doped drain 24. This ion implantation process forms a source/drain region 26 and completes the fabrication of a PMOS transistor or an NMOS transistor. Thereafter, a rapid thermal annealing process is performed by using a temperature between 900 degrees to 1000 degrees to activate the dopants injected into the semiconductor substrate 10 and repair the lattice structure of the substrate damaged during the ion implantation process.

As shown in FIG. 3, an etching process is conducted by using the gate structure 12, the offset spacer 18, and the spacer 20 as a mask to form a recess atop the gate 16 and in the source/drain region 26. Next, a baking process is performed by using a temperature between 700 degrees to 950 degrees to remove the remaining oxides from the surface of the recess 28 and repair the surface roughness of the recess.

After the baking process is conducted, as shown in FIG. 4, a selective epitaxial growth process is performed to form an epitaxial layer 30 composed of silicon germanium or silicon carbide in the recess 28, thereby completing the fabrication of a strained-silicon transistor. Specifically, materials used for forming the epitaxial layer can be selected according to the nature of the transistor. For instance, if the fabricated transistor is a PMOS transistor, the epitaxial layer can be composed of silicon germanium. On the other hand, if the fabricated transistor is an NMOS transistor, the epitaxial layer can be composed of silicon carbide.

It should be noted that the aforementioned fabrication process typically includes following drawbacks. First, an etching process is commonly conducted to form a recess in the source/drain region of the substrate after the formation of the epitaxial layer, as shown in FIG. 3. This step provides a growing surface for the epitaxial layer but also causes the dopants within the source/drain region to be gathered in the edge region of the recess, thereby inducing an uneven distribution of dopants and affecting the performance of the MOS transistor.

Secondly, after the formation of the source/drain region, a rapid thermal annealing process is conducted to activate the injected dopants by diffusing the dopants throughout the source/drain region. Under normal condition, the activated dopants should have perfect bonding. However, the baking process performed before the formation of the epitaxial layer typically utilizes a temperature lower than the rapid thermal annealing process to remove the remaining oxides from the surface of the recess and repair the surface roughness of the recess. Despite the fact that the baking process provides an ideal growing surface for the epitaxial layer, this lowered temperature carried by the baking process would disrupt the bonding of the dopants, which ultimately increases the overall resistance and induces a deactivation phenomenon.

Please refer to FIG. 5 and FIG. 6. FIG. 5 illustrates the operating current (Ion) and current leakage (Ioff) of a PMOS transistor under different baking temperatures whereas FIG. 6 illustrates the resistance of the PMOS transistor under different baking temperatures. As shown in FIG. 5, as the temperature of the baking process increases, the operating current of the PMOS transistor degrades accordingly. For instance, under the same leaking current, if a device being performed without any baking process were taken as a reference point, a device being performed with a baking process at 750 degrees would demonstrate a current degradation of approximately 7%, and a device being performed with a baking process at 850 degrees would demonstrate a current degradation of approximately 13.6%. Since the resistance of a device increases as the operating current decreases if the voltage remains unchanged, the resistance of the device would also increase accordingly as the temperature of the baking process increases. As shown in FIG. 6, as the temperature of the baking process increases up to approximately 850 degrees, the resistance of the PMOS transistor also reaches a maximum point. As discussed previously, an increase in resistance would result in a deactivation phenomenon and damage the bonds within the dopants. Due to the importance of the baking process in the current process for fabricating the epitaxial layer, how to improve the problem of deactivation caused after the baking process has become a critical task.

SUMMARY OF THE INVENTION

It is an objective of the present invention to provide a method of fabricating strained-silicon metal-oxide semiconductor transistors for solving the aforementioned problems.

A method for fabricating a strained-silicon transistor is disclosed. First, a semiconductor substrate having a gate structure thereon is provided. Next, a spacer is formed around the gate structure and a source/drain region is formed in the semiconductor substrate surrounding the spacer. A first rapid thermal annealing process is conducted thereafter to activate the dopants within the source/drain region and an etching process is performed to form a recess atop the gate structure and in the source/drain region respectively. Next, a selective epitaxial growth process is performed to form an epitaxial layer in each recess and a second rapid thermal annealing process is performed to redefine the distribution of dopants within the source/drain region and repair the damaged bonds within the dopants.

According to the preferred embodiment of the present invention, a second rapid thermal annealing process is specifically conducted after the formation of the epitaxial layer to improve the deactivation phenomenon caused by the baking process. It should be noted that this second rapid thermal annealing process not only redefines the distribution of dopants within the semiconductor substrate, but also repairs the bonds that are damaged by the lowered temperature of the baking process, thus increasing the overall performance of the MOS transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
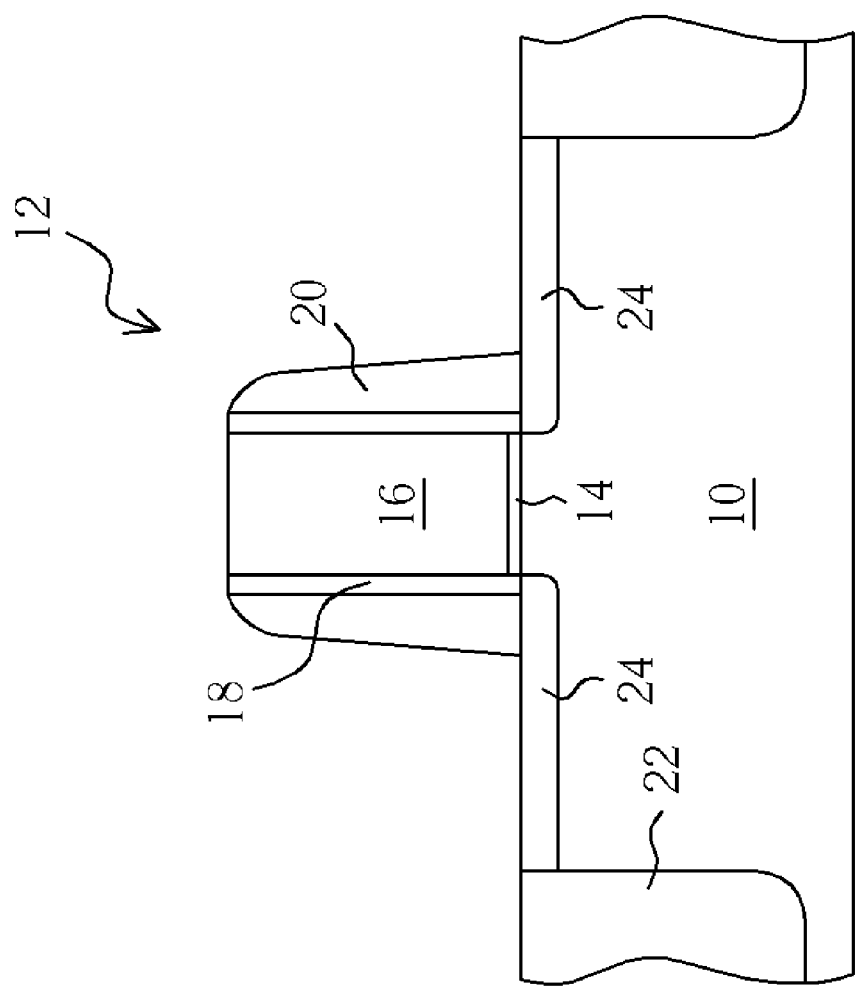
FIGS. 1-4 illustrate a method of utilizing selective epitaxial growth process for fabricating a strained-silicon transistor according to the prior art.
Figure 2:
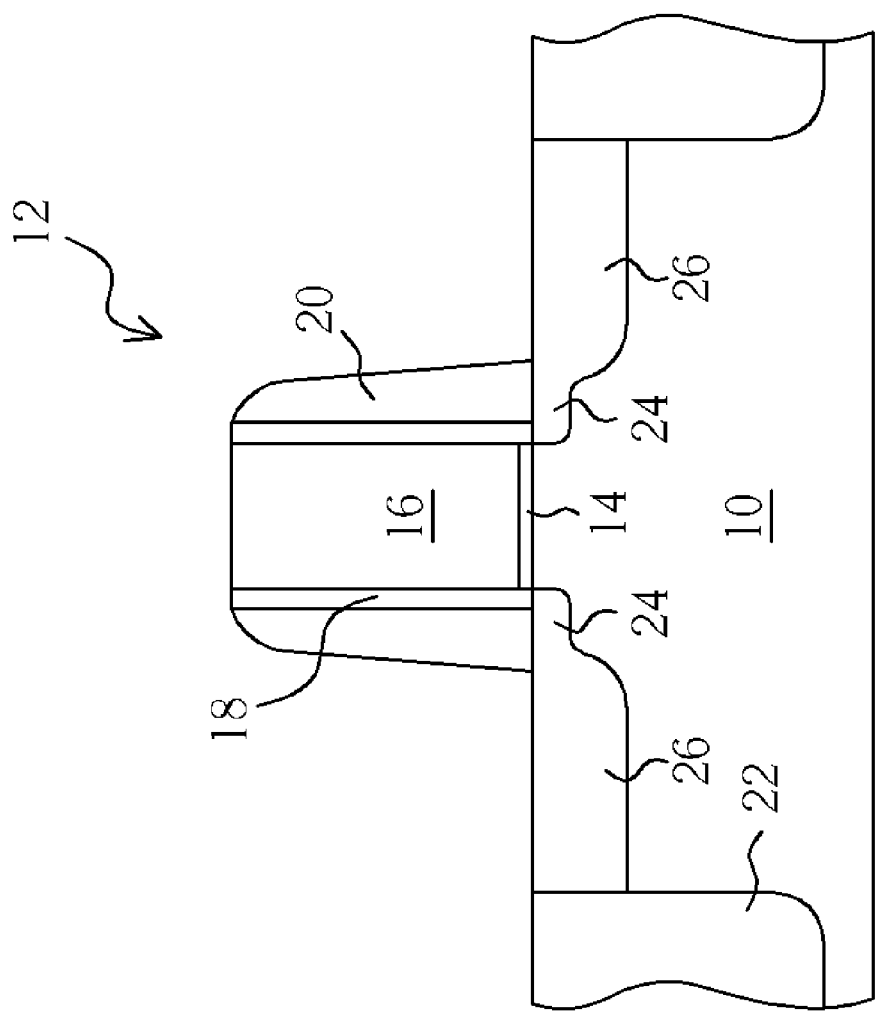
Figure 3:
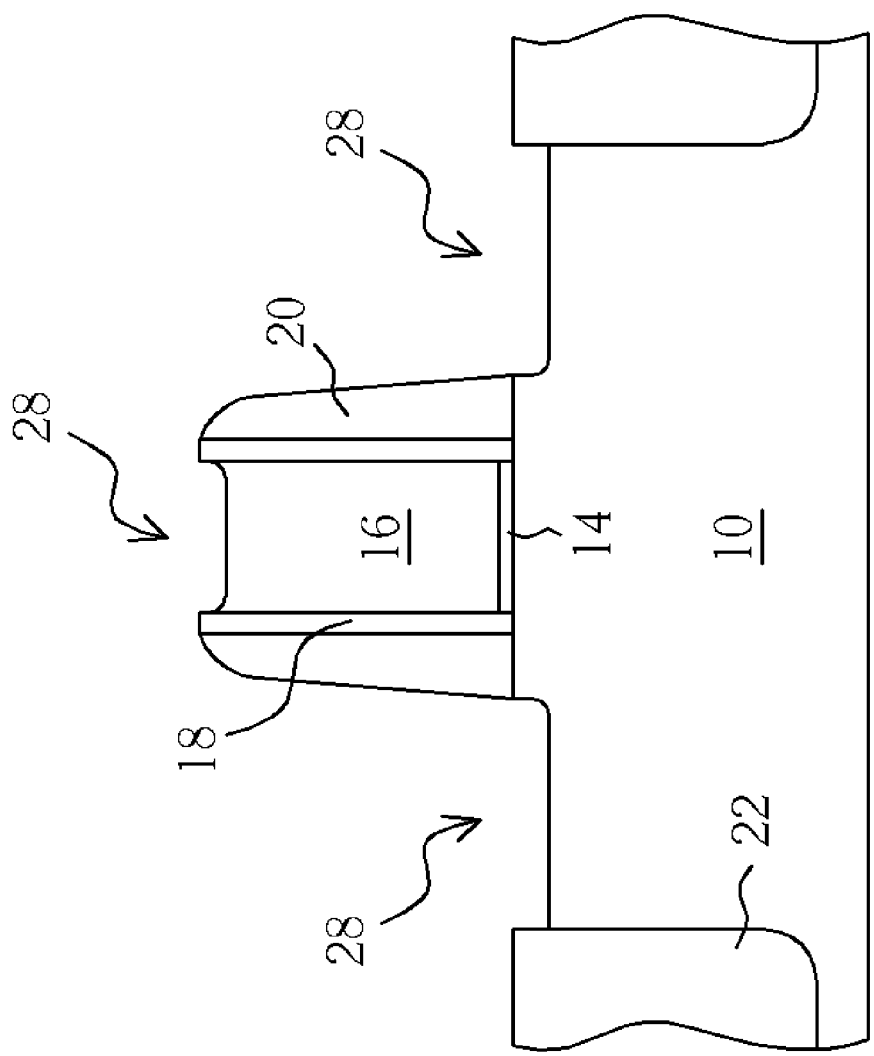
Figure 4:
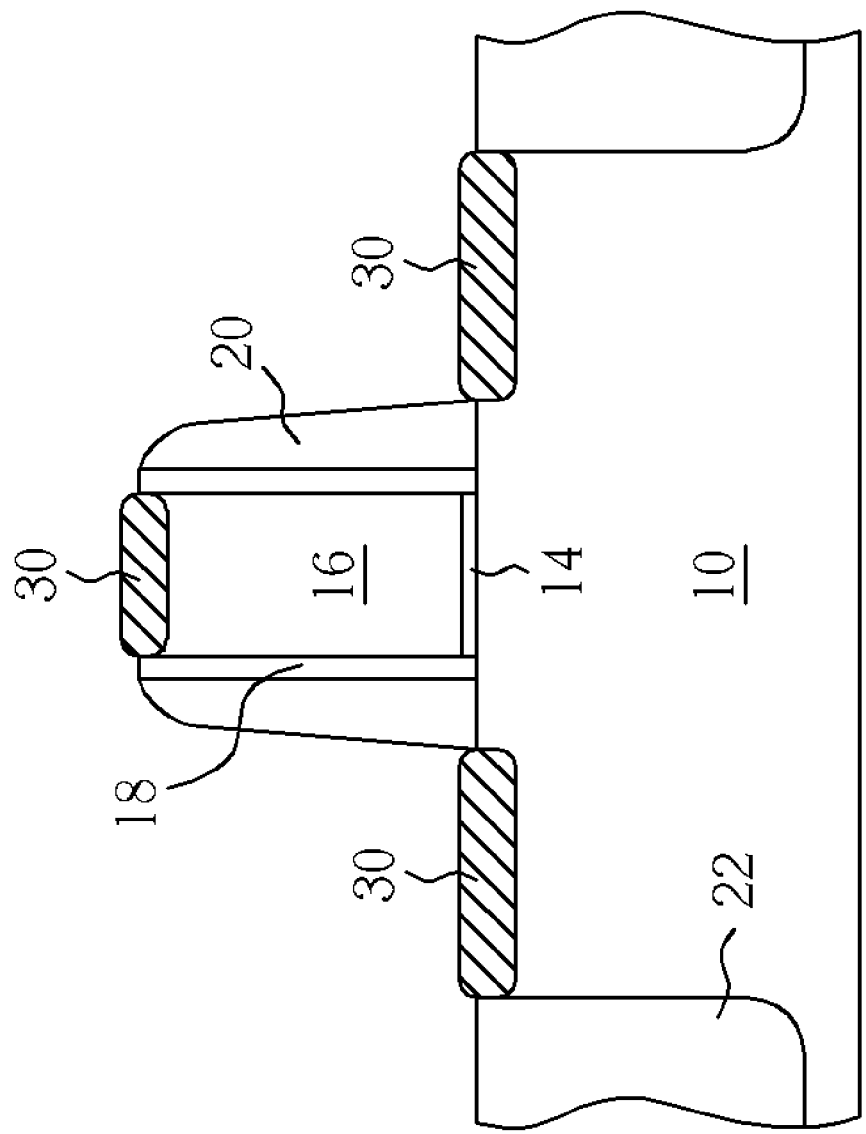
Figure 5:
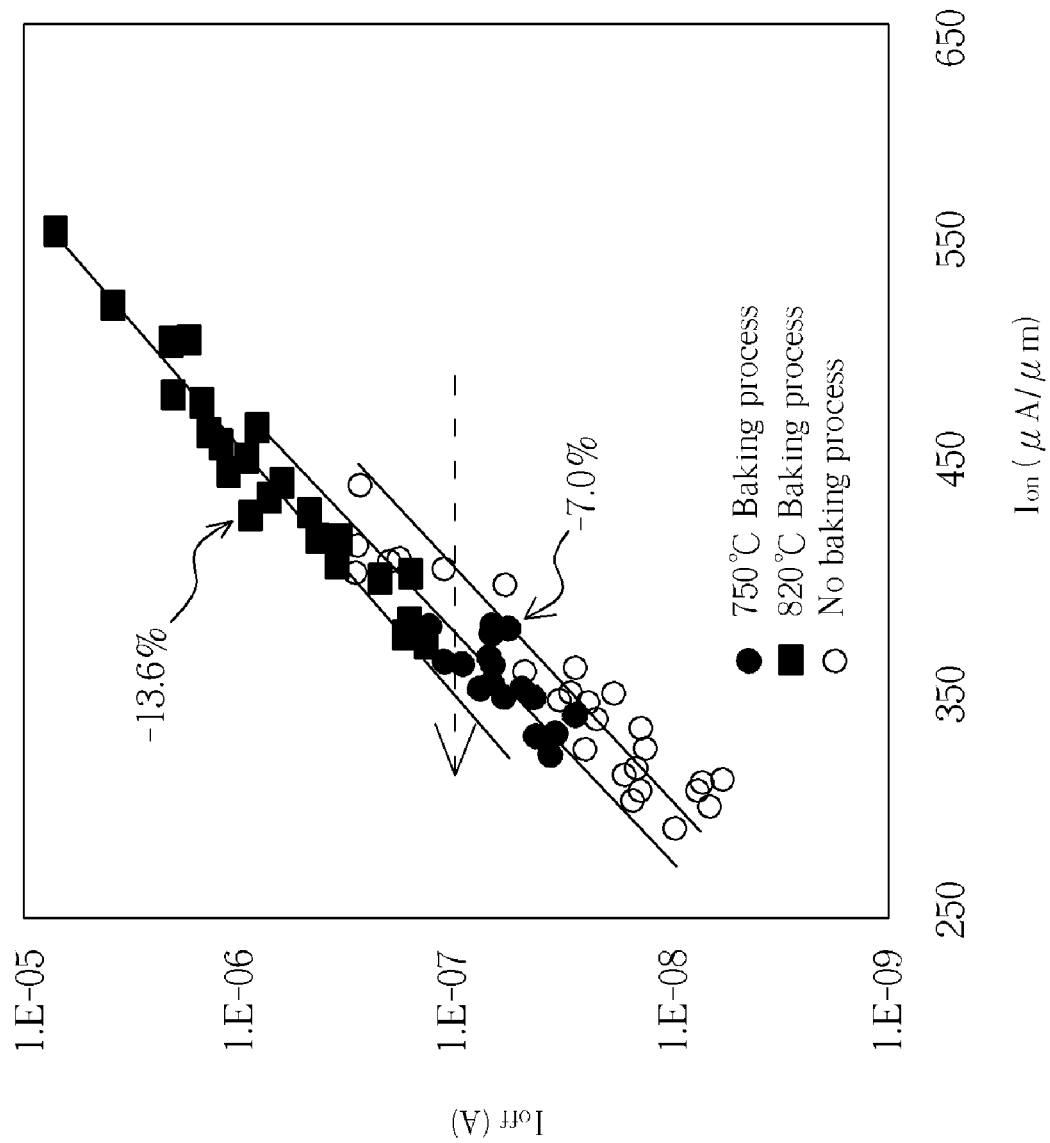
FIG. 5 illustrates the operating current (Ion) and current leakage (Ioff) of a PMOS transistor under different baking temperatures.
Figure 6:
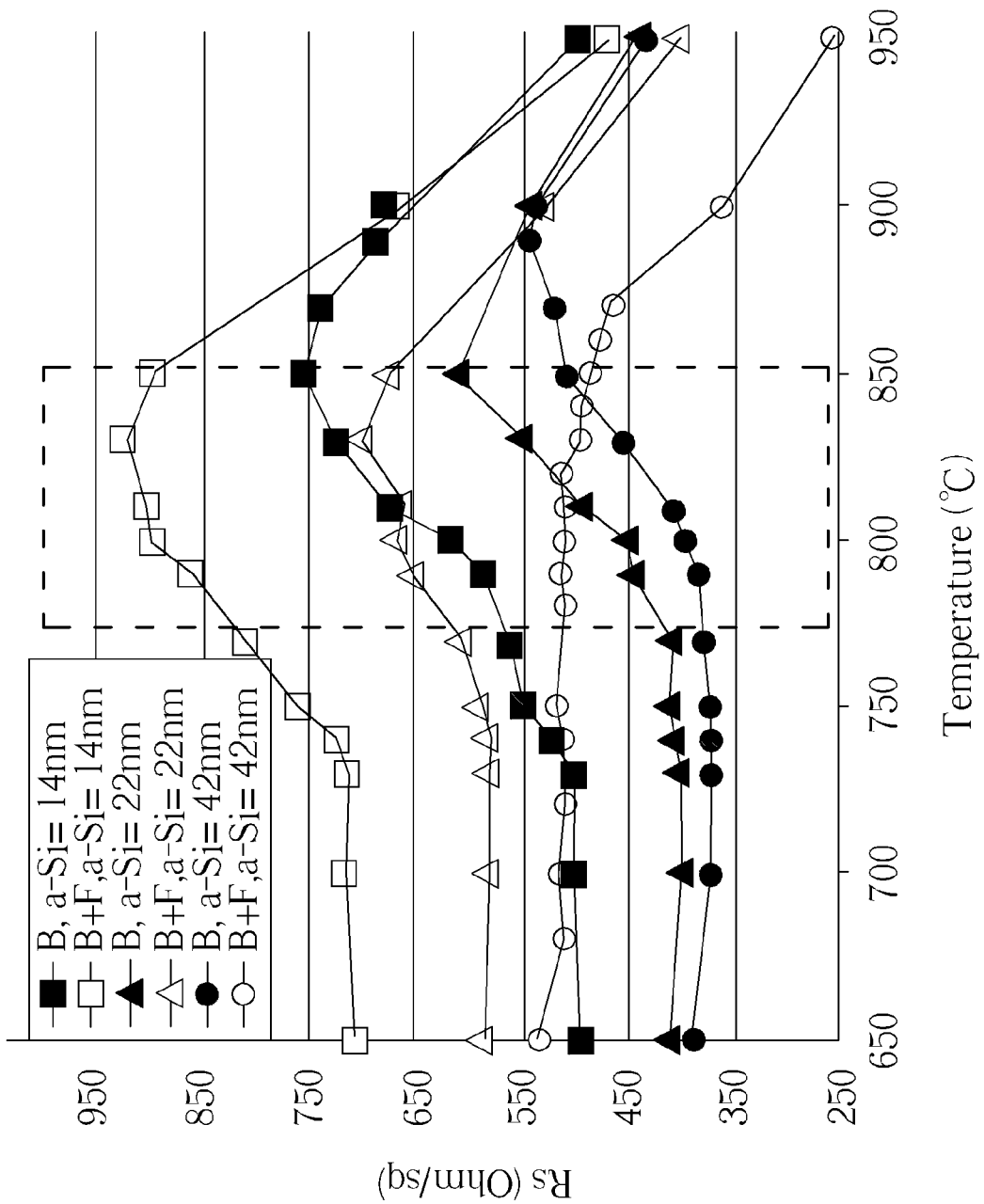
FIG. 6 illustrates the resistance of the PMOS transistor under different baking temperatures.
Figure 7:
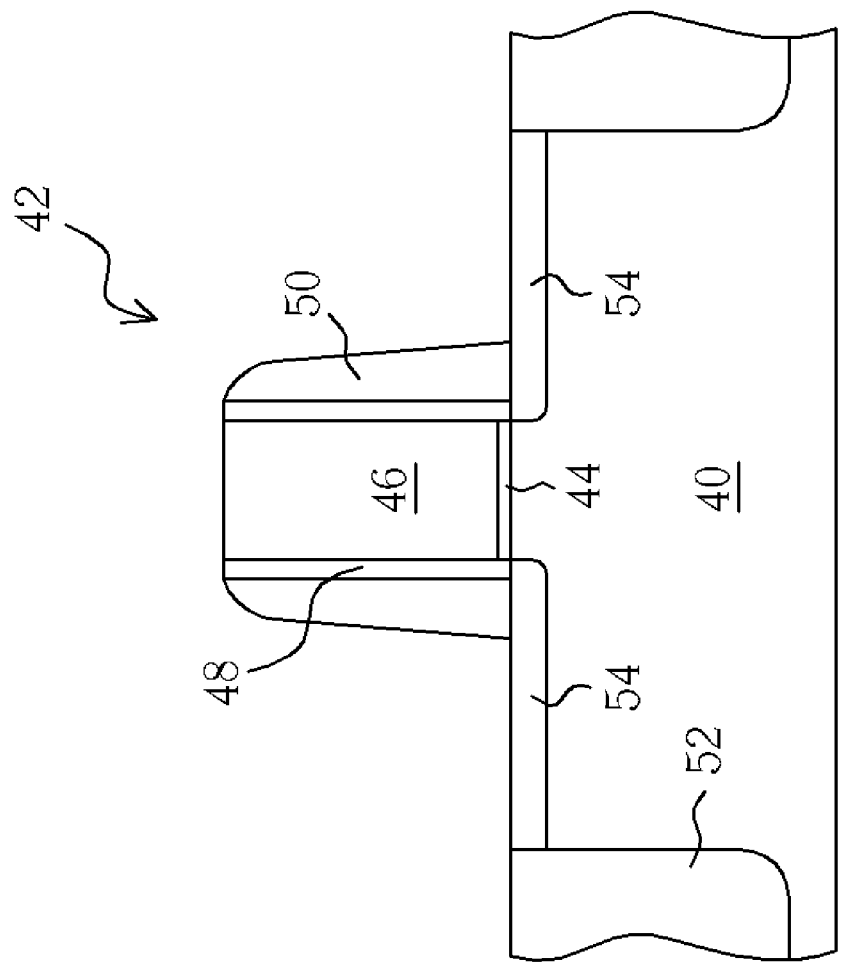
FIGS. 7-10 illustrate a method of utilizing selective epitaxial growth process for fabricating a strained-silicon metal-oxide semiconductor transistor according to the preferred embodiment of the present invention.

Please refer to FIGS. 7-10. FIGS. 7-10 illustrate a method of utilizing selective epitaxial growth process for fabricating a strained-silicon metal-oxide semiconductor transistor according to the preferred embodiment of the present invention. As shown in FIG. 7, a semiconductor substrate 40, such as a silicon substrate is first provided. The semiconductor substrate 40 includes a gate structure 42 thereon, in which the gate structure 42 includes a gate dielectric 44 and a gate 46 disposed on the gate dielectric 44. An ion implantation process is performed thereafter to inject a p-type or n-type dopant of smaller concentration into the semiconductor substrate 40. The implantation process preferably forms a lightly doped drain 54 in the semiconductor substrate 40 surrounding the gate structure 42. An offset spacer 48 is formed on the sidewall of the gate structure 42 and a spacer 50 is formed around the offset spacer 48 thereafter. Preferably, the gate dielectric 44 is composed insulating materials such as silicon dioxide, the gate 46 is composed of conductive materials such as doped polysilicon, and the offset spacer 48 and the spacer 50 are composed of insulating materials such as oxides or nitride-oxides. The active area of the semiconductor substrate 40 including the gate structure 42 is preferably encompassed by a shallow trench isolation 52.

Figure 8:
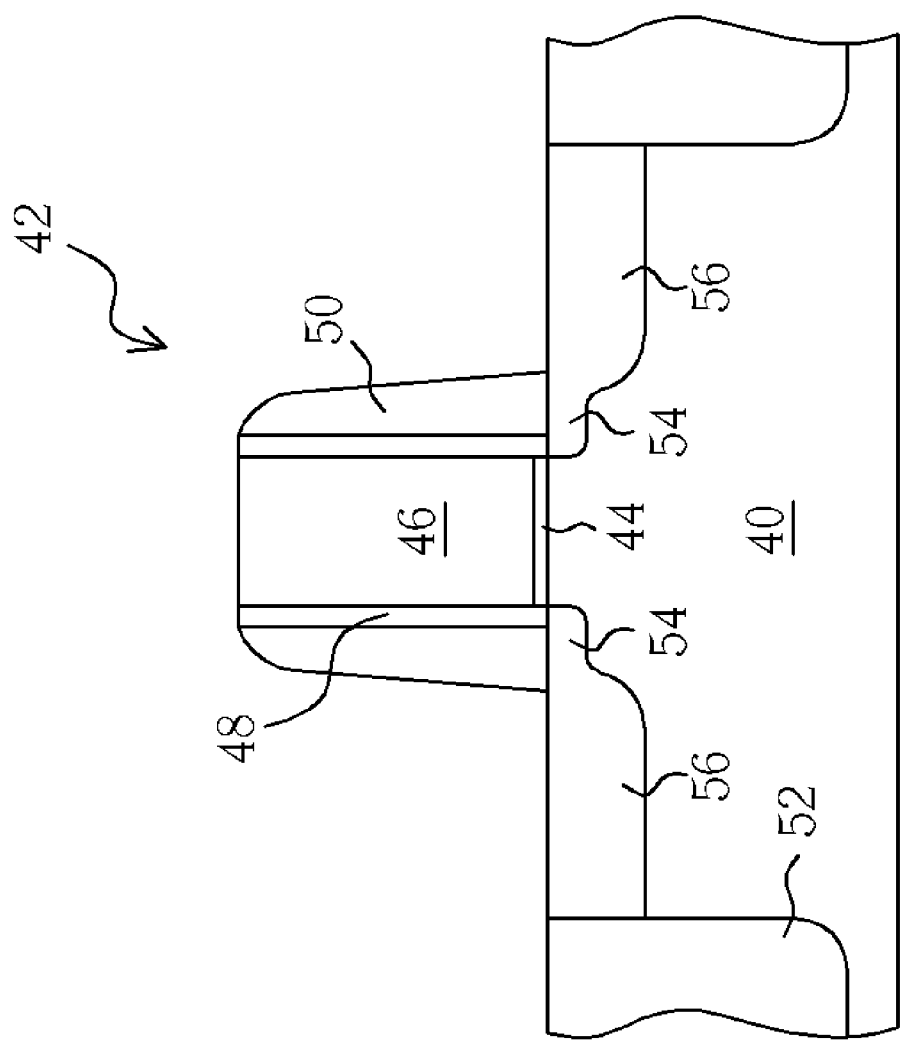

As shown in FIG. 8, another ion implantation process is performed to inject a p-type or n-type dopant of higher concentration into the semiconductor substrate 40 surrounding the lightly doped drain 54. This ion implantation process forms a source/drain region 56 and completes the fabrication of a PMOS transistor or an NMOS transistor. Thereafter, a rapid thermal annealing process is performed by using a temperature of 900 degrees to 1000 degrees to activate the dopants injected into the semiconductor substrate 40 and repair the lattice structure of the substrate damaged during the ion implantation process. According to the preferred embodiment of the present invention, the duration of this rapid thermal annealing process is between 10 seconds to 30 seconds.

Figure 9:
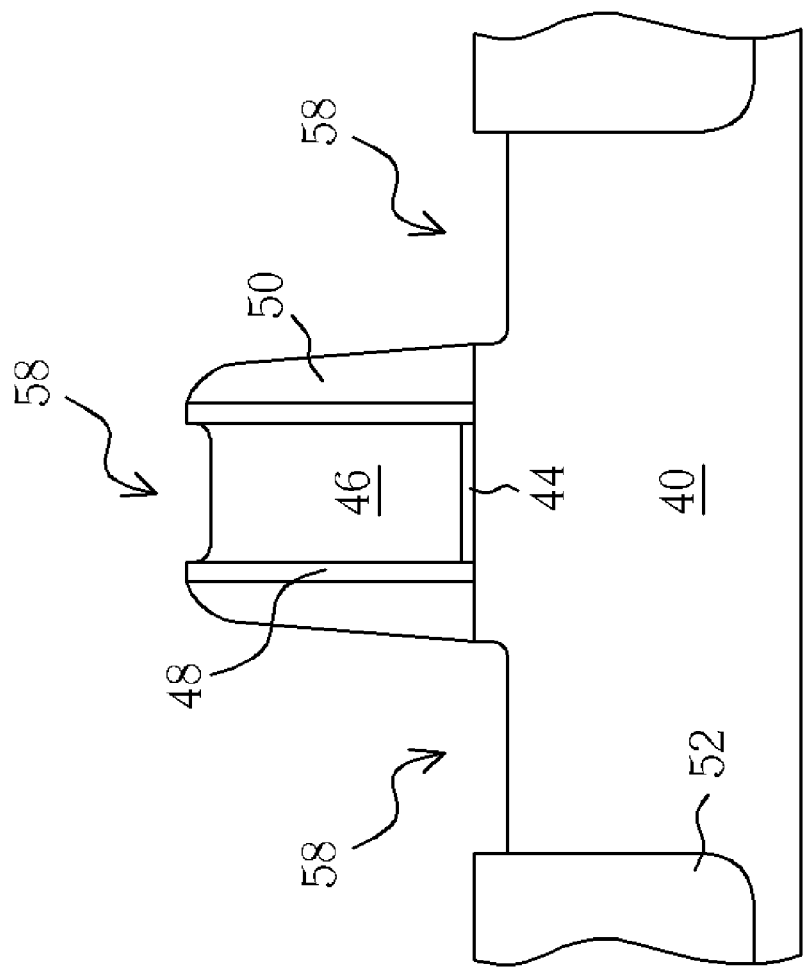

As shown in FIG. 9, an etching process is conducted by using the gate structure 42, the offset spacer 48, and the spacer 50 as a mask to form a recess 58 atop the gate 46 and in the source/drain region 56 respectively. Next, a baking process is performed by using a temperature between 700 degrees to 950 degrees to remove the remaining oxides from the surface of the recess 58 and repair the surface roughness of the recess 58.

Figure 10:
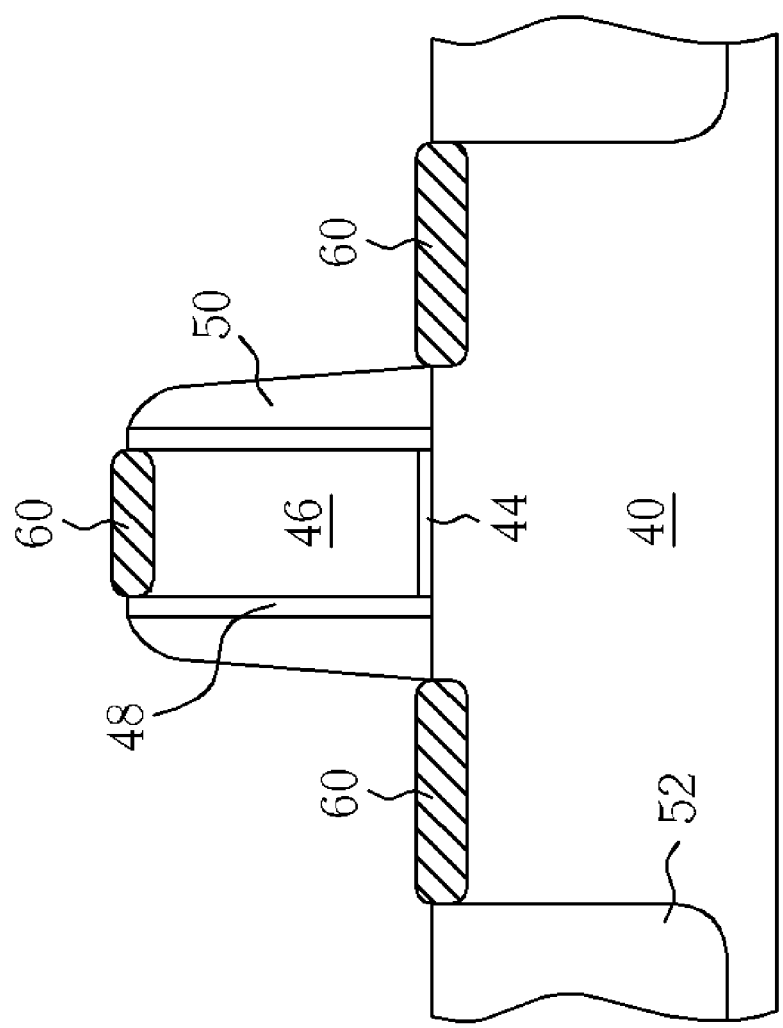

After the baking process is conducted, as shown in FIG. 10, a selective epitaxial growth process is performed to form an epitaxial layer 60 composed of silicon germanium or silicon carbide in each recess 58, thus completes the fabrication of a strained-silicon transistor. Specifically, materials used for forming the epitaxial layer 60 can be altered according to the nature of the transistor. For instance, if the fabricated transistor is a PMOS transistor, the epitaxial layer can be composed of silicon germanium. On the other hand, if the fabricated transistor is an NMOS transistor, the epitaxial layer can be composed of silicon carbide.

After the formation of the epitaxial layer 60, another rapid thermal annealing process is performed by using a temperature between 900 degrees to 1100 degrees to re-activate the dopants injected into the semiconductor substrate 40. Similar to the first rapid thermal annealing process conducted previously, the duration of the second rapid thermal annealing process can be between 10 seconds to 30 seconds. Thereafter, a millisecond annealing process can be conducted by using a higher temperature of approximately 1000 degrees to 1350 degrees to increase the solubility of the injected dopants to an optimal level. According to the preferred embodiment of the present invention, the millisecond annealing process is preferably a laser annealing process, in which the duration of the millisecond annealing process is between 100 milliseconds to 1 microsecond.

It should be noted that the baking process conducted before the formation of the epitaxial layer would damage the bonds within the implanted dopants and induce a deactivation phenomenon. The present invention thus performs an additional rapid thermal annealing process after the formation of the epitaxial layer to resolve this issue. According to the preferred embodiment of the present invention, this second rapid thermal annealing process can be utilized to redefine the distribution of the dopants within the semiconductor substrate and repair the bonds damaged during the baking process, thereby increasing the overall performance of the transistor.

Figure 11:
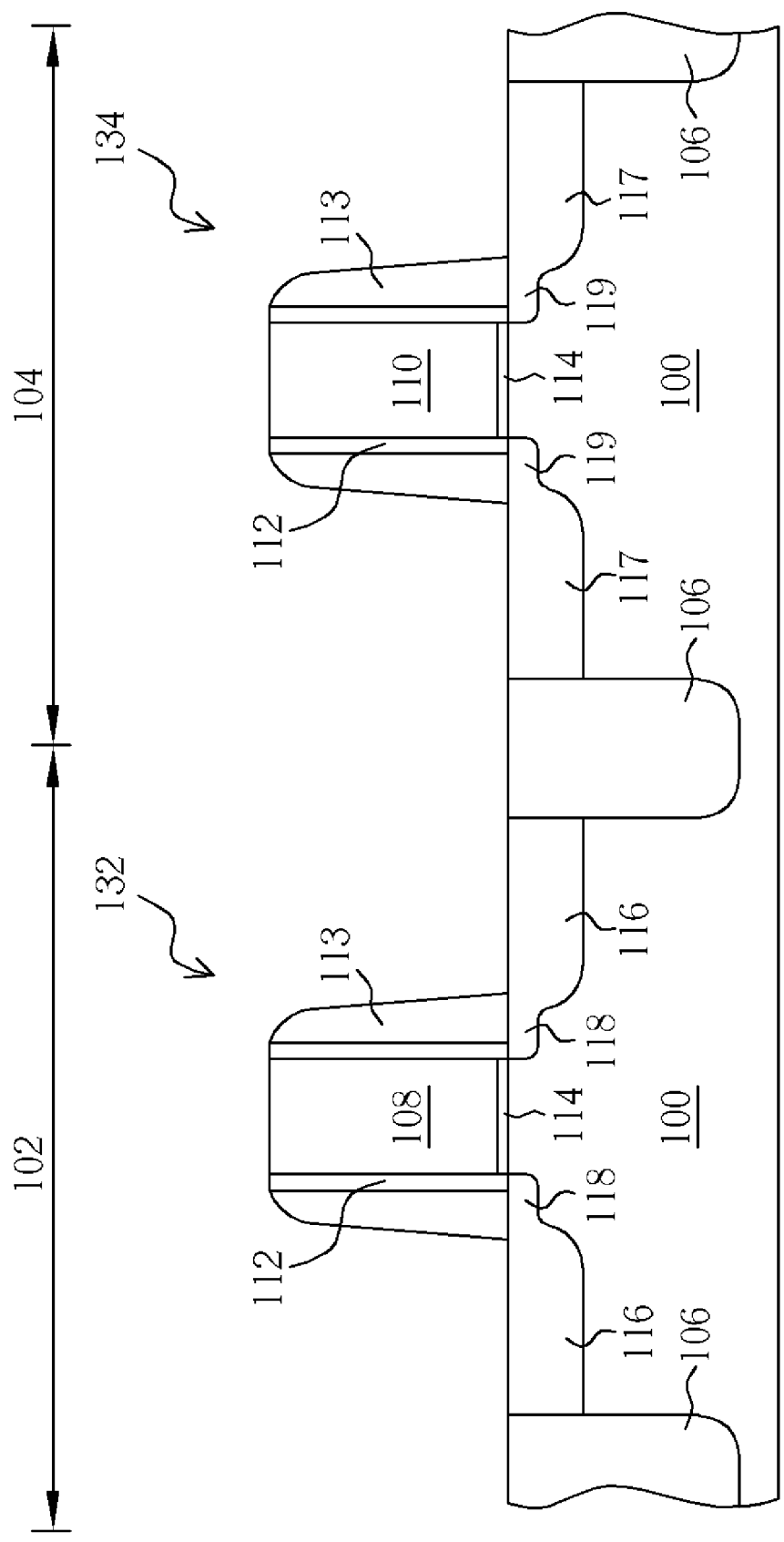
FIGS. 11-13 illustrate a method of utilizing selective epitaxial growth process for fabricating a strained-silicon CMOS transistor according to an embodiment of the present invention.
Figure 12:
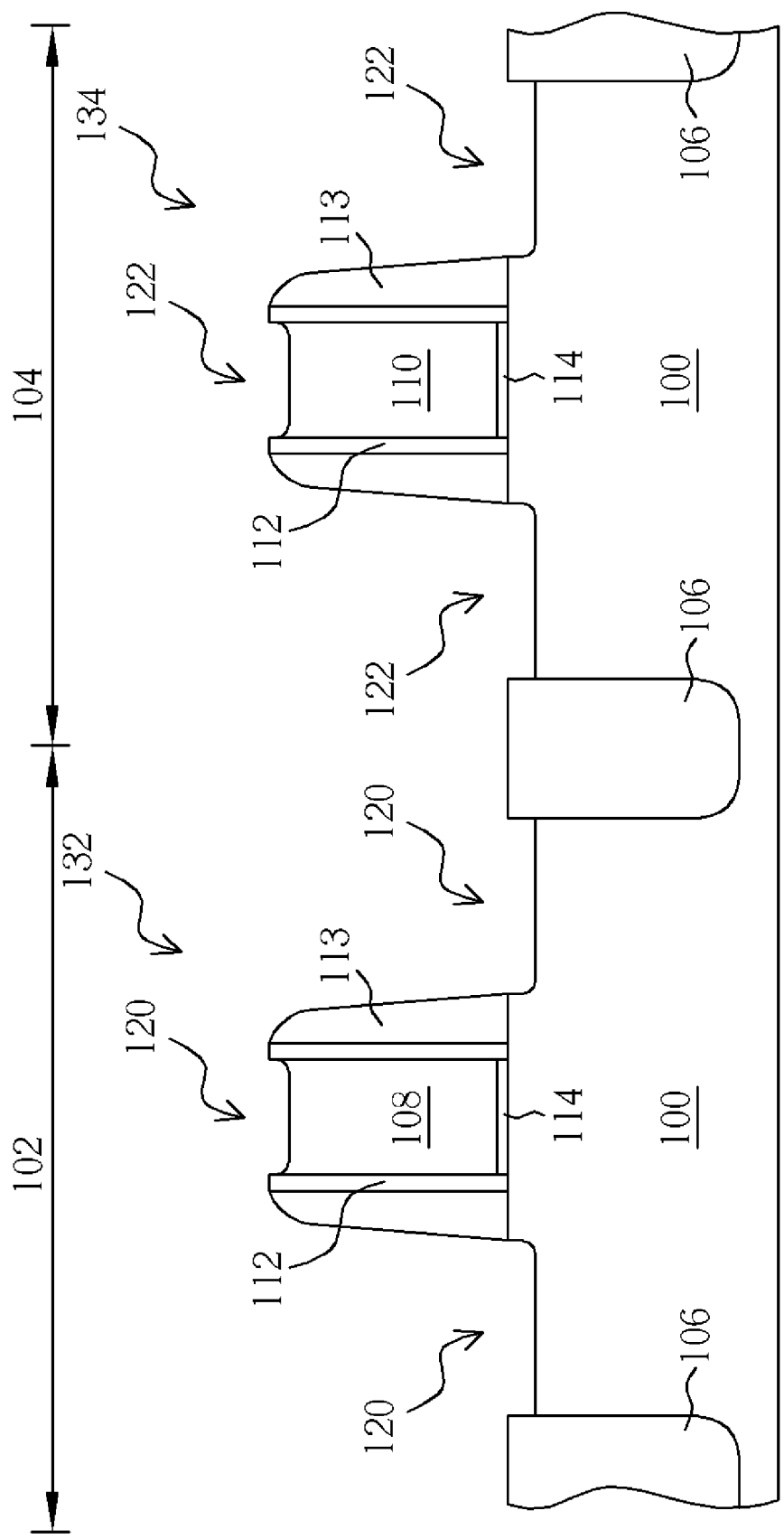
Figure 13:
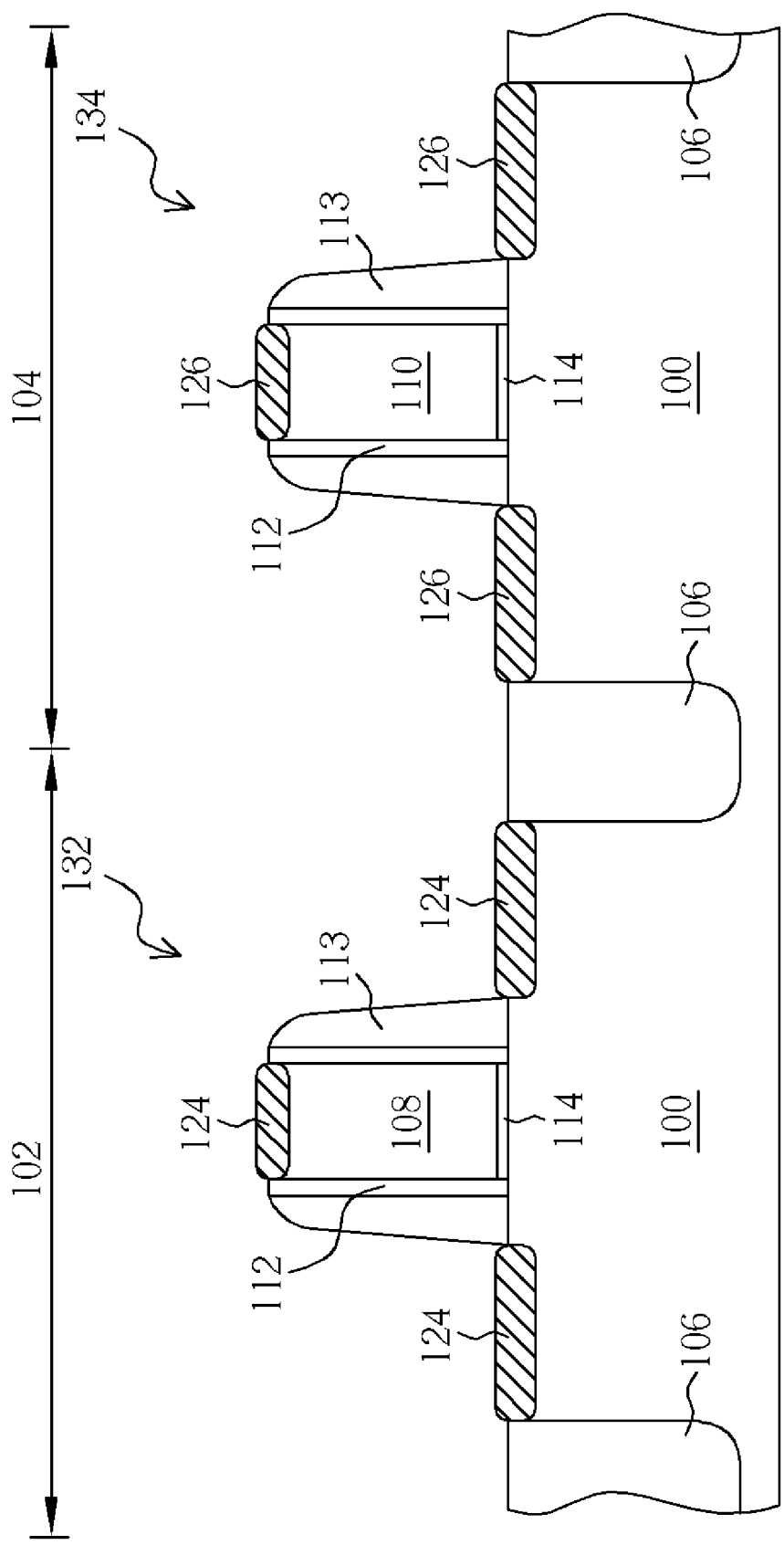

According to an embodiment of the present invention, the aforementioned process can be further applied for fabricating strained-silicon CMOS transistors. Referring to FIGS. 11-13, a semiconductor substrate 100 having an NMOS region 102 and a PMOS region 104 is provided, in which the NMOS region 102 and the PMOS region 104 are separated by a shallow trench isolation 106. Each of the NMOS region 102 and the PMOS region 104 includes a gate structure. The NMOS gate structure includes an NMOS gate 108 and a gate dielectric 114 disposed between the NMOS gate 108 and the semiconductor substrate 100. The PMOS gate structure includes a PMOS gate 110 and a gate dielectric 114 disposed between the PMOS gate 110 and the semiconductor substrate 100. An ion implantation process is conducted to inject a p-type dopant and an n-type dopant with lower concentration into the semiconductor substrate 100 around the NMOS gate 108 and the PMOS gate 110 for forming lightly doped drains 118 and 119 in the corresponding NMOS region 102 and the PMOS region 104. An offset spacer 112 and a spacer 113 are formed on the sidewall of the NMOS gate 108 and the PMOS gate 110 respectively.

Next, another ion implantation process is performed to inject a p-type dopant and an n-type dopant with higher concentration into the semiconductor substrate 100 for forming source/drain regions 116 and 117 surrounding the lightly doped drains 118 and 119. A rapid thermal annealing process is then conducted by using a temperature between 900 degrees to 1100 degrees to activate the dopants injected into the substrate and at the same time repair the lattice structure of the substrate surface that is damaged during the implantation process.

As shown in FIG. 12, an etching process is performed to form a recess 120 atop the NMOS gate 108 and in the source/drain region 116 surrounding the NMOS gate 108 and a recess 122 atop the PMOS gate 110 and in the source/drain region 117 surrounding the PMOS gate 110. A baking process is conducted thereafter by using a temperature between 700 degrees to 950 degrees to remove the remaining oxides from the surface of the recess 120 and 122 and repair the surface roughness of each recess.

After the baking process is conducted, as shown in FIG. 13, a selective epitaxial growth process is conducted to form an epitaxial layer 124 composed of silicon carbide in the recess 120 of the NMOS region 102 and an epitaxial layer 126 composed silicon germanium in the recess 122 of the PMOS region 104.

Thereafter, another rapid thermal annealing process is conducted by using a temperature of 900 degrees to 1100 degrees to reactivate the dopants within the substrate. Similar to the first rapid thermal annealing process conducted for forming the source/drain region, the duration of the second rapid thermal annealing process is also between 10 seconds to 30 seconds. Subsequently, a millisecond annealing process can be conducted by using a higher temperature of approximately 1000 degrees to 1350 degrees to increase the solubility of the injected dopants to an optimal level. According to the preferred embodiment of the present invention, the millisecond annealing process is preferably a laser annealing process, in which the duration of the millisecond annealing process is preferably between 100 milliseconds to 1 microsecond. This completes the fabrication of a strained-silicon CMOS transistor.

Due to the fact that the process of forming an epitaxial layer in the recess of the source/drain region would induce an uneven distribution of dopants and the baking process conducted before the formation of the epitaxial layer would damage the bonds within the implanted dopants and result in a deactivation phenomenon, the present invention specifically performs an additional rapid thermal annealing process after the formation of the epitaxial layer to resolve these issues. According to the preferred embodiment of the present invention, this second rapid thermal annealing process can be used to redefine the distribution of the dopants within the semiconductor substrate and repair the bonds damaged during the baking process, thereby increasing the performance of the transistor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a strained-silicon metal-oxide semiconductor transistor, comprising:
    providing a semiconductor substrate;
    forming a gate structure on the semiconductor substrate;
    forming a lightly doped drain in the semiconductor substrate after forming the gate structure;
    forming a spacer around the gate structure;
    forming a source/drain region in the semiconductor substrate surrounding the spacer;
    performing a first rapid thermal annealing process for activating the dopants within the source/drain region and the lightly doped drain;
    performing an etching process for forming a recess on the gate structure and the source/drain region surrounding the gate structure respectively;
    performing a selective epitaxial growth process for forming an epitaxial layer in each recess; and
    performing a second rapid thermal annealing process on the source/drain region and the lightly doped drain for redefining the distribution of dopants within the source/drain region and the lightly doped drain and repairing the damaged bonds within the dopants.

2. The method for fabricating a strained-silicon metal-oxide semiconductor transistor of claim 1, wherein the gate structure comprises:
    a gate dielectric; and
    a gate disposed on the gate dielectric.

3. The method for fabricating a strained-silicon metal-oxide semiconductor transistor of claim 1 further comprising forming a lightly doped drain in the semiconductor substrate after forming the gate structure on the semiconductor substrate.

4. The method for fabricating a strained-silicon metal-oxide semiconductor transistor of claim 1, wherein the temperature of the first rapid thermal annealing process and the second rapid thermal annealing process is between 900 degrees to 1100 degrees.

5. The method for fabricating a strained-silicon metal-oxide semiconductor transistor of claim 1, wherein the duration of the first rapid thermal annealing process and the second rapid thermal annealing process is between 10 seconds to 30 seconds.

6. The method for fabricating a strained-silicon metal-oxide semiconductor transistor of claim 1 further comprising performing a millisecond annealing process after the second rapid thermal annealing process.

7. The method for fabricating a strained-silicon metal-oxide semiconductor transistor of claim 6, wherein the temperature of the millisecond annealing process is between 1000 degrees to 1350 degrees.

8. The method for fabricating a strained-silicon metal-oxide semiconductor transistor of claim 6, wherein the duration of the millisecond annealing process is between 100 milliseconds to 1 microsecond.

9. The method for fabricating a strained-silicon metal-oxide semiconductor transistor of claim 1 further comprising performing a baking process before forming the epitaxial layer.

10. The method for fabricating a strained-silicon metal-oxide semiconductor transistor of claim 9, wherein the temperature of the baking process is between 700 degrees to 950 degrees.

11. The method for fabricating a strained-silicon metal-oxide semiconductor transistor of claim 1, wherein the strained-silicon metal-oxide semiconductor transistor is a PMOS transistor.

12. The method for fabricating a strained-silicon metal-oxide semiconductor transistor of claim 11, wherein the epitaxial layer comprises silicon germanium.

13. The method for fabricating a strained-silicon metal-oxide semiconductor transistor of claim 1, wherein the strained-silicon metal-oxide semiconductor transistor is an NMOS transistor.

14. The method for fabricating a strained-silicon metal-oxide semiconductor transistor of claim 13, wherein the epitaxial layer comprises silicon carbide.

15. A method for fabricating a strained-silicon CMOS transistor, comprising:
providing a semiconductor substrate having a first active region for fabricating a first transistor, a second active region for fabricating a second transistor, and an insulating structure disposed between the first active region and the second active region;
forming a first gate structure on the first active region and a second gate structure on the second active region;
forming a lightly doped drain for the first transistor and a lightly doped drain for the second transistor;
forming a spacer around the first gate structure and the second gate structure respectively;
forming a source/drain region for the first transistor and a source/drain region for the second transistor;
performing a first rapid thermal annealing process for activating the dopants within the source/drain region and the lightly doped drain;
performing an etching process for forming a first recess on the first gate structure and in the source/drain region surrounding the first gate structure and a second recess on the second gate structure and in the source/drain region surrounding the second gate structure;
performing a baking process and then a selective epitaxial growth process for forming a first epitaxial layer in the first recess and a second epitaxial layer in the second recess; and
performing a second rapid thermal annealing process on the source/drain region and the lightly doped drain after the baking process for redefining the distribution of dopants within the source/drain regions and the lightly doped drain and repairing the damaged bonds within the dopants.

16. The method for fabricating a strained-silicon CMOS transistor of claim 15, wherein the first gate structure comprises:
a first gate dielectric; and
a first gate disposed on the first gate dielectric.

17. The method for fabricating a strained-silicon CMOS transistor of claim 15, wherein the second gate structure comprises:
a second gate dielectric; and
a second gate disposed on the second dielectric.

18. The method for fabricating a strained-silicon CMOS transistor of claim 15, wherein the temperature of the first rapid thermal annealing process and the second rapid thermal annealing process is between 900 degrees to 1100 degrees.

19. The method for fabricating a strained-silicon CMOS transistor of claim 15, wherein the duration of the first rapid thermal annealing process and the second rapid thermal annealing process is between 10 seconds to 30 seconds.

20. The method for fabricating a strained-silicon CMOS transistor of claim 15 further comprising performing a millisecond annealing process after the second rapid thermal annealing process.

21. The method for fabricating a strained-silicon CMOS transistor of claim 20, wherein the temperature of the millisecond annealing process is between 1000 degrees to 1350 degrees.

22. The method for fabricating a strained-silicon CMOS transistor of claim 20, wherein the duration of the millisecond annealing process is between 100 milliseconds to 1 microsecond.

23. The method for fabricating a strained-silicon CMOS transistor of claim 15, wherein the temperature of the baking process is between 700 degrees to 950 degrees.

24. The method for fabricating a strained-silicon CMOS transistor of claim 15, wherein the first transistor is an NMOS transistor and the second transistor is a PMOS transistor.

25. The method for fabricating a strained-silicon CMOS transistor of claim 24, wherein the first epitaxial layer comprises silicon carbide.

26. The method for fabricating a strained-silicon CMOS transistor of claim 24, wherein the second epitaxial layer comprises silicon germanium.

27. A method for fabricating a strained-silicon metal-oxide semiconductor transistor, comprising:
providing a semiconductor substrate;
forming a gate structure on the semiconductor substrate;
forming a lightly doped drain in the semiconductor substrate after forming the gate structure;
forming a spacer around the gate structure;
forming a source/drain region in the semiconductor substrate surrounding the spacer, wherein the source/drain region excludes the lightly doped drain;
performing a first rapid thermal annealing process for activating the dopants within the source/drain region and the lightly doped drain;
performing an etching process for forming a recess on the gate structure and the source/drain region surrounding the gate structure respectively;
performing a selective epitaxial growth process for forming an epitaxial layer in each recess; and
performing a second rapid thermal annealing process on the source/drain region and the lightly doped drain for redefining the distribution of dopants within the source/drain region and the lightly doped drain and repairing the damaged bonds within the dopants.

* * * * *